(12) United States Patent
Seifert et al.

(10) Patent No.: US 7,916,920 B2
(45) Date of Patent: Mar. 29, 2011

(54) TRANSMITTER/RECEIVER ANTENNA FOR MR WITH IMPROVED DECOUPLING BETWEEN ANTENNA ELEMENTS

(75) Inventors: Frank Seifert, Hohen Neuendorf (DE); Evgenia Kirilina, Berlin (DE); Thomas Riemer, Leipzig (DE)

(73) Assignees: Bundesrepublik Deustschland, vertreten durch das Bundesministerium für Wirtschaft und Technologie, dieses vertreten durch den Präsidenten der Physikalisch-Technischen Bundesanstalt, Braunschweig (DE); Universität Leipzig, Leipzig (DE)

( * ) Notice: Subject to any disclaimer, the term of this patent is extended or adjusted under 35 U.S.C. 154(b) by 0 days.

(21) Appl. No.: 12/600,721

(22) PCT Filed: May 15, 2008

(86) PCT No.: PCT/DE2008/000873
§ 371 (c)(1),
(2), (4) Date: Nov. 18, 2009

(87) PCT Pub. No.: WO2008/141638
PCT Pub. Date: Nov. 27, 2008

(65) Prior Publication Data
US 2010/0166279 A1   Jul. 1, 2010

(30) Foreign Application Priority Data
May 18, 2007   (DE) .......................... 10 2007 023 542

(51) Int. Cl.
*G06K 9/00*   (2006.01)
(52) U.S. Cl. ............ 382/131; 378/4; 250/338.2; 430/39
(58) Field of Classification Search .................. 382/100, 382/128, 131, 320; 378/4–27; 250/338.2; 430/39
See application file for complete search history.

(56) References Cited

U.S. PATENT DOCUMENTS 4,764,726 A * 8/1988 Misic et al. ................... 324/322
(Continued)

FOREIGN PATENT DOCUMENTS

WO         4016 640        12/1991
(Continued)

*Primary Examiner* — Anand Bhatnagar
(74) *Attorney, Agent, or Firm* — Whitham Curtis Christofferson & Cook, PC

(57) ABSTRACT

A magnetic resonance tomograph is provided with a magnetic resonance system comprising at least two high-frequency transmitting/receiving units, each containing 1) a high-frequency transmitting/receiving coil, 2) a high-frequency current source that can be coupled to the high-frequency transmitting/receiving coil for transmitting, and 3) an amplifier that can be coupled to the high-frequency transmitting/receiving coil for receiving. A selector switch is provided, which keys a supply voltage to disconnect the amplifier during a transmission operation and the high-frequency current source during a receiving operation from the high-frequency transmitting/receiving coil. An inductor and a capacitor are provided between the high-frequency transmitting/receiving coil and the amplifier and form a series resonating circuit at the magnetic resonance frequency. A first diode is disposed between the selector switch and the capacitor of the series resonance circuit, and a second diode is disposed between the high-frequency current source and the high-frequency transmitting/receiving coil, such that the magnetic resonance system can be placed in a transmission mode by means of the selector switch, in that the first diode conducts and the high-frequency current source applies a high-frequency coil current to the high-frequency transmitting/receiving coil, and can be placed in a receiving mode, in that the second diode has high resistance and a voltage is applied to the amplifier from the high-frequency transmitting/receiving coil via the inductor and the capacitor.

7 Claims, 1 Drawing Sheet

U.S. PATENT DOCUMENTS

| | | |
|---|---|---|
| 5,230,090 A | 7/1993 | Zametzer et al. |
| 5,489,847 A | 2/1996 | Nabeshima et al. |
| 6,501,274 B1 | 12/2002 | Ledden |
| 6,608,480 B1 | 8/2003 | Weyers |
| 2003/0184293 A1 | 10/2003 | Boskamp |
| 2005/0134270 A1 | 6/2005 | Dumoulin et al. |
| 2005/0242816 A1 | 11/2005 | Kurpad et al. |

FOREIGN PATENT DOCUMENTS

| | | |
|---|---|---|
| WO | 103 25 634 | 1/2005 |
| WO | WO 2007/130696 | 11/2007 |

\* cited by examiner

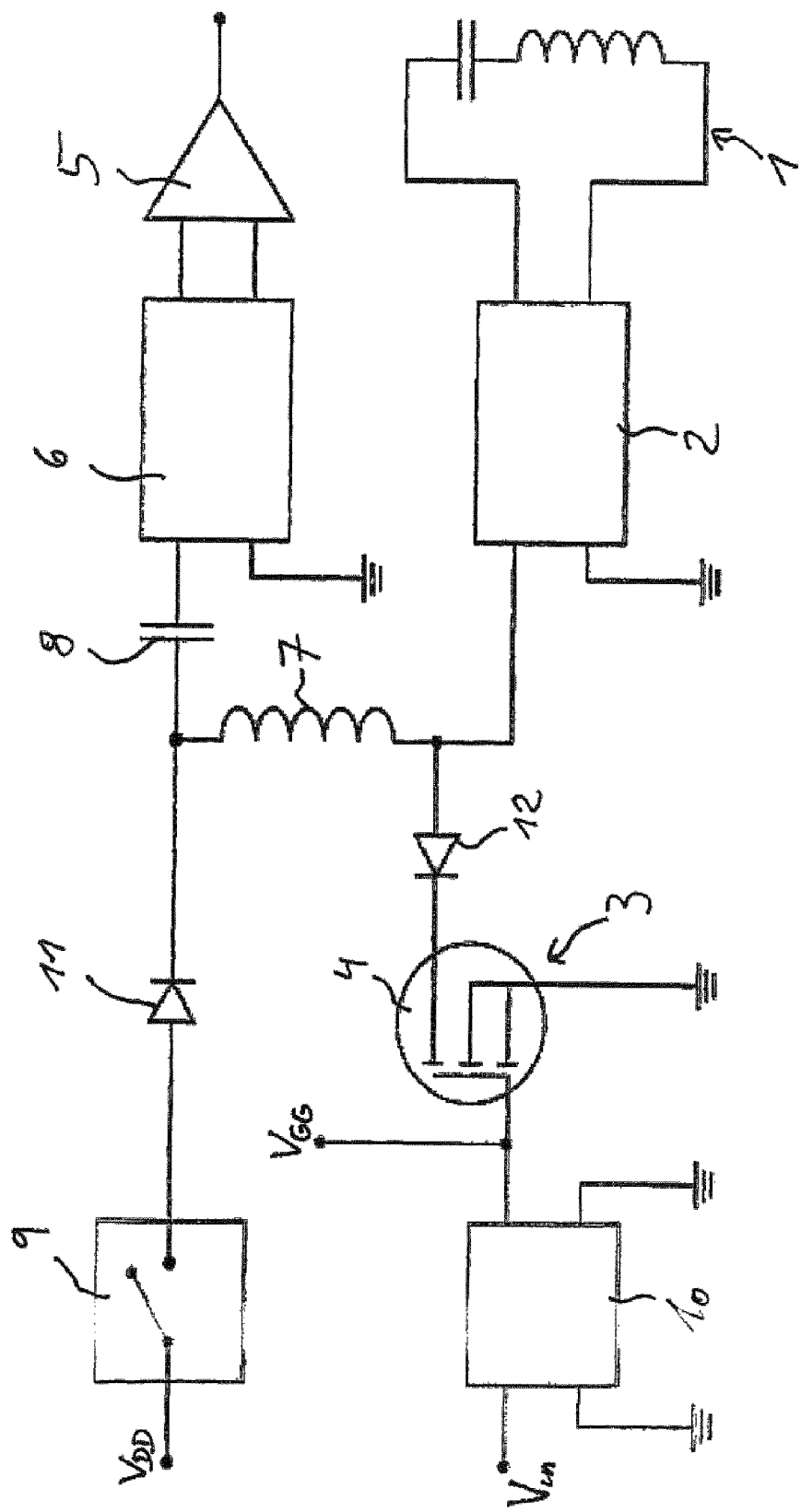
Figure

TRANSMITTER/RECEIVER ANTENNA FOR MR WITH IMPROVED DECOUPLING BETWEEN ANTENNA ELEMENTS

BACKGROUND OF THE INVENTION

1. Field of the Invention

The present invention relates to a magnetic resonance scanner with a magnetic resonance system comprising at least two radiofrequency transmitter/receiver units which each have a radiofrequency transmitter/receiver coil, a radiofrequency current source which can be coupled to the radiofrequency transmitter/receiver coil for the transmission, and an amplifier (5) which can be coupled to the radiofrequency transmitter/receiver coil for the reception. According to a second aspect, the invention relates to a method for controlling a magnetic resonance scanner.

2. Background Description

The requirements for modern magnetic resonance systems for magnetic resonance imaging (MRI) and magnetic resonance spectroscopy (MRS) necessitate the use of radiofrequency units which have a plurality of coil elements. In this context, the utilized radiofrequency coils are conventionally referred to as radiofrequency antennas. Here, combinations of resonant radiofrequency coils and/or radiofrequency antennas are frequently used, with the individual antennas being excited by alternating voltage sources.

In order to generate the well-defined radiofrequency magnetic field in a sample body, e.g. in a patient in magnetic resonance imaging, required for the magnetic resonance experiment, the current has to be monitored or controlled in each individual antenna element. However, this current control is hindered by mutual coupling of the individual antenna elements; this constitutes an increasing problem in both transmission processes and reception processes, particularly in the case of relatively high frequencies. The coupling amongst the antenna elements leads to a distortion of the sensitivity profile of the coil in the antenna element during the reception and furthermore reduces the homogeneity of the radiofrequency magnetic field during transmission.

According to U.S. Pat. No. 5,489,847, additional inductive or capacitive decoupling elements are provided for decoupling the antenna elements of a magnetic resonance array coil comprising a plurality of coils. However, a disadvantage of such solutions is that these can only be applied in certain antenna configurations. Decoupling networks proposed as an alternative thereto can only be utilized with great difficulty in practical application because this network has to be reoptimized for every object to be examined. By way of example, if utilized in magnetic resonance imaging, this generally requires a renewed optimization of the decoupling network for each individual patient to be examined.

US 2005/0242816 A1 discloses a transmitter coil array, in which the individual antenna elements are decoupled. The antenna current can be controlled in a targeted fashion due to the use of radiofrequency current sources; this makes it possible to effectively decouple the individual antenna elements from one another. Although the system described therein allows a decoupling of the individual antennas during transmission, the document provides no indication for decoupling during a reception process.

The noise of the current source used for transmission in particular leads to an unacceptable deterioration of the signal-to-noise ratio during the reception process. A further cutting limitation of the system for the use in magnetic resonance scanners is the strong impairment of the homogeneity of the static magnetic field in the system by the components which control the coil currents in a targeted fashion, and by the direct current portion of the radiofrequency current source. Finally, the provision of an antenna element array for transmission and a further array of additional antenna elements for reception is very costly as a result of the additionally required components.

DE 40 16 640 A1 discloses a transmitter/receiver switch with PIN diodes for nuclear magnetic resonance equipment. The transmitter/receiver switch is designed such that no separate direct current power supply is required. It is disadvantageous that the switch described therein does not permit a current-controlled operation of the magnetic resonance scanner and hence there are measurement errors due to couplings between radiofrequency transmitter/receiver units. U.S. Pat. No. 4,764,726 discloses a changeover switch for nuclear magnetic resonance equipment which has the same disadvantages.

US 2003/0184293 A1 discloses a magnetic resonance system which comprises a transmitter/receiver switch. The disadvantage therein lies in the fact that such a system implies the use of impedance-matched radiofrequency feed lines and separate radiofrequency amplifiers for actuating the radiofrequency coils. Thus, a current-controlled operation of the radiofrequency coil is not possible in this case either, and so scattered fields lead to measurement errors.

DE 103 25 634 A1 discloses a low-noise preamplifier for magnetic resonance technology. However, this document does not disclose how the preamplifier can be combined with a radiofrequency current source such that a current-controlled operation is possible. If there is no current-controlled operation, induced voltages can cause measurement errors.

SUMMARY OF THE INVENTION

Against this backdrop, it is the object of the present invention to improve, in a simple and cost-effective fashion, the generation of well-defined magnetic fields in a sample body.

This object is achieved by a magnetic resonance system of the type in question with a changeover switch designed to separate the amplifier in a transmission process and the radiofrequency current source in a reception process from the radiofrequency transmitter/receiver coil, an inductor and a capacitor provided between the radiofrequency transmitter/receiver coil and the amplifier and forming an series-resonant circuit at the magnetic resonance frequency, a first diode arranged between the changeover switch and the capacitor of the series-resonant circuit, and a second diode arranged between the radiofrequency current source and the radiofrequency transmitter/receiver coil, such that, by means of the changeover switch, the magnetic resonance system can be brought into a transmission mode in which the first diode conducts and the radiofrequency current source actuates the radiofrequency transmitter/receiver coil using a radiofrequency coil current and can be brought into a reception mode in which the second diode has a high resistance and a voltage from the radiofrequency transmitter/receiver coil reaches the amplifier via the inductor and the capacitor.

The object is furthermore achieved by a method in which a switch is effected by separating from the radiofrequency transmitter/receiver coil the amplifier during transmission and the radiofrequency current source during reception, wherein the switch into a transmission mode is effected by a first diode arranged between the changeover switch and the capacitor of the series-resonant circuit and a second diode arranged between the radiofrequency current source and the radiofrequency transmitter/receiver coil being brought into a conductive state such that the radiofrequency current source actuates the radiofrequency transmitter/receiver coil using a radiofrequency coil current and wherein the switch into a reception mode is effected by bringing the second diode into a high resistance state such that a voltage from the radiofrequency transmitter/receiver coil reaches the amplifier via the inductor and the capacitor.

In a magnetic resonance system of the type mentioned initially, provision is made for a changeover switch designed to separate the amplifier in a transmission process and the radiofrequency current source in a reception process from the radiofrequency transmitter/receiver coil.

The core of the invention consists of arranging the individual components of the radiofrequency transmitter/receiver unit such that the switch according to the invention in each case separates a portion of the overall circuit from another portion and so the antenna element used both during transmission and reception is in each case only coupled to the portion of the circuit with the components essential for the current process. Hence one and the same antenna can be used for both the transmission process and reception process and hence the overall number of required antenna elements is reduced.

In a magnetic resonance system according to the invention, provision is preferably made for a multiplicity of radiofrequency transmitter/receiver units, the amplifiers of which have a high input impedance. The high input impedance ensures a low current flow which therefore only generates weak interfering magnetic fields.

In a resonance system according to the invention, provision is advantageously made for the radiofrequency current source to have a radiofrequency power MOSFET. The amplifier is preferably a GaAs FET amplifier.

In order to reduce an impairment of the homogeneity of the magnetic field by electronic components, the radiofrequency current source should be arranged at a sufficient distance from the radiofrequency transmitter/receiver coil and should be connected to the latter via a radiofrequency feed line.

The radiofrequency transmitter/receiver coil is advantageously connected to the amplifier via at least one radiofrequency feed line. The length of the radiofrequency feed lines in each case preferably corresponds to an integer multiple of the half of the wavelength.

Provision is preferably made for the radiofrequency transmitter/receiver coil to be designed to form an series-resonant circuit at the magnetic resonance frequency.

Provision is advantageously made for an inductor and a capacitor which form an series-resonant circuit at the magnetic resonance frequency and are arranged between the radiofrequency transmitter/receiver coil and the amplifier.

In the method according to the invention, provision is advantageously made for at least two radiofrequency transmitter/receiver units which are decoupled from one another such that, during transmission, the radiofrequency voltages induced in the respective other radiofrequency transmitter/receiver unit result in a radiofrequency current flow due to the coupling with the radiofrequency current source being reduced and that, during reception, the radiofrequency voltage induced in the radiofrequency transmitter/receiver unit results in a radiofrequency current flow due to the coupling with the amplifier being reduced. As a result of this, the considered radiofrequency transmitter/receiver unit has at least a significantly reduced—or even no—magnetic coupling with the respectively other radiofrequency transmitter/receiver unit.

In particular, the magnetic resonance system comprises at least one radiofrequency transmitter/receiver unit which has a radiofrequency transmitter/receiver coil, a radiofrequency current source which can be coupled to the radiofrequency transmitter/receiver coil for the transmission, and an amplifier which can be coupled to the radiofrequency transmitter/receiver coil for the reception, wherein the changeover switch is designed to separate the amplifier in a transmission process and the radiofrequency current source in a reception process from the radiofrequency transmitter/receiver coil.

In order to control the magnetic resonance system with the at least one radiofrequency transmitter/receiver unit, for the transmission, a radiofrequency transmitter/receiver coil is coupled to the radiofrequency current source in order to generate a certain radiofrequency magnetic field. For the reception, the radiofrequency transmitter/receiver coil in which a voltage is induced by a resonating magnetic field is coupled to an amplifier. The switch is effected by separating the amplifier during transmission and the radiofrequency current source during reception from the radiofrequency transmitter/receiver coil.

In particular provision is made for two radiofrequency transmitter/receiver units which are decoupled from one another such that, during transmission, the radiofrequency voltages induced in the respective other radiofrequency transmitter/receiver unit result in a radiofrequency current flow due to the coupling with the radiofrequency current source being reduced and that, during reception, the radiofrequency voltage induced in the radiofrequency transmitter/receiver unit results in a radiofrequency current flow due to the coupling with the amplifier being reduced.

BRIEF DESCRIPTION OF THE DRAWINGS

In the following text, the invention will be described in more detail in an exemplary fashion on the basis of a detailed description of an embodiment with reference to the appended drawing in which the sole FIGURE is a schematic circuit diagram of the embodiment.

DETAILED DESCRIPTION OF A PREFERRED EMBODIMENT OF THE INVENTION

The only FIGURE shows a schematic circuit diagram of an individual radio frequency transmitter/receiver unit for a magnetic resonance system according to the invention which has a multiplicity of such radio frequency transmitter/receiver units. The individual circuit illustrated in the FIGURE has a radio frequency transmitter/receiver coil 1 which serves as an antenna element. The radio frequency transmitter/receiver coil 1 is operated in series resonance at the nuclear magnetic resonance frequency.

The radio frequency transmitter/receiver coil 1 is coupled to a radio frequency current source 3 which can be controlled in a targeted fashion via a suitable radio frequency feed line 2, the length of which corresponds to an integer multiple of the half of the wavelength and which line is often referred to as λ/2 RF line. The current source 3, which can be controlled in a targeted fashion, of the circuit illustrated in the FIGURE has a radio frequency power MOSFET 4.

Furthermore, the circuit has an amplifier 5 as a preamplifier for a reception signal, e.g. a GaAs FET amplifier. Said amplifier is likewise coupled to the circuit via a suitable radio frequency feed line 6, the length of which corresponds to an integer multiple of the half of the wavelength. Furthermore, provision is made in the illustrated circuit for a coil 7 and a capacitor 8 which form a series: resonant LG element. According to the invention, a switch 9 is used to switch between a transmission process and a reception process.

The radio frequency current source 3 is based on a MOSFET transistor 4 which is kept at its optimum working point by two direct voltage sources $V_{DD}$ (drain voltage) and $V_{GG}$ (gate voltage). The radio frequency voltage $V_{in}$ to be sent is superposed on the direct voltage $V_{GG}$ applied to the gate connection by a suitable adaptation network 10. This affords the possibility of controlling the coil current supplied to the radio frequency transmitter/receiver coil 1 in such a targeted fashion that it is possible to perform an efficient and effective decoupling of the individual radio frequency transmitter/receiver coils 1 from a plurality of radio frequency transmitter/receiver units of the magnetic resonance system according to the invention during the transmission process.

The switch between a transmission phase and a reception phase is implemented by keying the supply voltage $V_{DD}$. This functionality results from the fact that, in a magnetic resonance experiment, the transmission and reception processes always occur at separate times. In the transmission mode, that is to say when the switch 9 is closed and the drain voltage $V_{DD}$ is applied to the MOSFET 4, the radio frequency coil current is, controlled by the radio frequency current source 3 in a targeted fashion whereas the amplifier 5 is separated or decoupled from the radio frequency transmitter/receiver coil 1 in the transmission mode by a conducting diode 11 arranged between the switch 9 and the capacitor 8: of the LC element.

If commercially available power MOSFETs are used, the magnetic resonance system can generate radio frequency magnetic fields of an order of magnitude which would require a radio frequency power intake of 50 to 100 watt in the case of a conventional actuation of the transmitter/receiver coil elements.

By contrast, in the reception mode, the radio frequency current source 3 is separated or decoupled from the radio frequency transmitter/receiver coil 1 by a now highly resistant diode 12, while the signals induced in the radio frequency transmitter/receiver coil 1 are fed to the amplifier 5 via the low-resistance series resonant LC element 7, 8. The high input impedance of the amplifier 5 itself leads to a decoupling of the radiofrequency transmitter/receiver coils 1 from a plurality of radio frequency transmitter/receiver units during the reception process. Although the outer resonant magnetic field induces a corresponding resonance voltage in the antenna elements, there is only a small current flow due to the high impedance. As a result of the low current flow, the magnetic field which always results in the case of flowing currents is also small and so the interference effected thereby is significantly reduced.

The circuit according to this embodiment of the invention solves the problem for mutually coupled resonant magnetic resonance antenna elements of radio frequency transmitter/receiver elements in the case of transmission and reception by a novel combination of two decoupling strategies: firstly by an active and targeted control of the radio frequency coil current during the transmission and secondly by the coupling of amplifiers 5 with high input impedances during the reception.

The main advantage of the invention lies in the, compared to previous solutions, improved decoupling of adjacent antenna elements in multi-element coils during both the transmission and the reception. The advantage of the current control used during the transmission process is that the possibility of the decoupling no longer depends on the spatial arrangement and interconnection of the individual antennas. This increases the possibility of realizing novel coil geometries which are tailor-made for certain magnetic resonance applications.

A further decisive advantage lies in the simplified impedance matching to the frequency of the magnetic resonance experiment. By decoupling the individual elements, they can be calibrated individually and without time-consuming iterative steps. It is also advantageous that the decoupling of the individual elements generates a higher radio frequency magnetic field in the sample or the patient because the parasitic excitation of the adjacent coils is avoided. This also affords the possibility of reducing the radio frequency power, and hence the specific absorption rate (SAR), absorbed in the measuring object or patient, as a result of which a safer patient operation can be implemented.

Since the transmission phase in a magnetic resonance system is generally significantly shorter than the reception phase, the described mode of the transmitter/receiver circuit according to the invention at the same time drastically reduces the average power loss in the power MOSFET 4. It is for this reason that complex cooling measures can be dispensed with.

The use of a multiplicity of coil elements affords the possibility of generating homogeneous, radio frequency magnetic fields in the sample object or in the patient, like using a conventional volume coil but without expensive pulsed power amplifiers with powers in the kilowatt range being necessary. Furthermore, the targeted actuation, of individual elements or groups of a few elements can improve local control of the radio frequency power absorbed in the patient, as a result of which the magnetic resonance scanner can be operated with a significantly reduced SAR. Hence, an operation can also be performed with, in particular, patients with active implants, for example with a cardiac pacemaker, or with passive implants such as artificial joints, etc., for whom a reliable use of a magnetic resonance scanner had previously not been possible without endangering said patient.

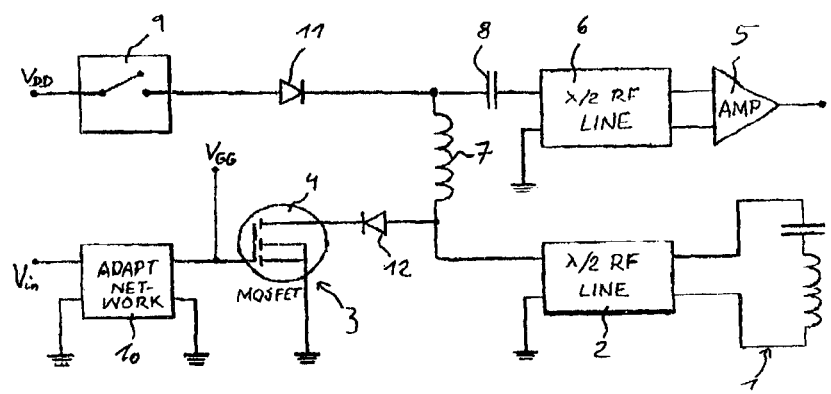

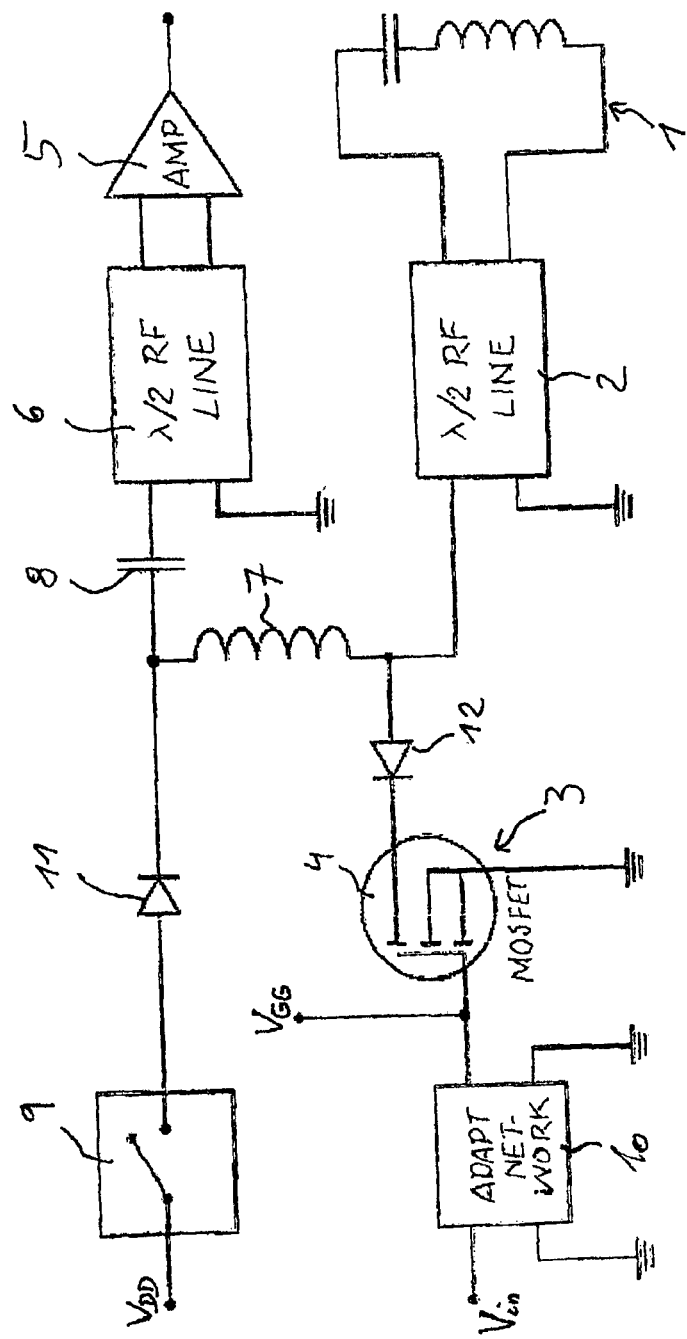

The invention claimed is:

1. A magnetic resonance scanner with a magnetic resonance system comprising at least two radio frequency transmitter/receiver units which each comprise:
    (a) a radio frequency transmitter/receiver coil,
    (b) a radio frequency current source coupled to the radio frequency transmitter/receiver coil for the transmission,
    (c) an amplifier coupled to the radio frequency transmitter/receiver coil for the reception,
    (d) a changeover switch designed to key a supply voltage to separate the amplifier in a transmission process and the radio frequency current source in a reception process from the radio frequency transmitter/receiver coil,
    (e) an inductor and a capacitor provided between the radio frequency transmitter/receiver coil and the amplifier and forming a series-resonant circuit at the magnetic resonance frequency,
    (f) a first diode arranged between the changeover switch (9) and the capacitor of the series-resonant circuit, and
    (g) a second diode arranged between the radio frequency current source and the radio frequency transmitter/receiver coil,
    wherein, by means of the changeover switch, the magnetic resonance system
        (i) can be brought into a transmission mode in which the first diode conducts and the radio frequency current source actuates the radio frequency transmitter/receiver coil using a radio frequency coil current, and
        (ii) can be brought into a reception mode in which the second diode has a high resistance and a voltage from the radio frequency transmitter/receiver coil reaches the amplifier via the inductor and the capacitor.

2. The magnetic resonance scanner as claimed in claim 1, characterized in that the radio frequency current source is a radio frequency power MOSFET.

3. The magnetic resonance scanner as claimed in claim 2, characterized in that the amplifier is a GaAs FET amplifier.

4. The magnetic resonance scanner as claimed in claim 1, characterized in that the radio frequency transmitter/receiver coil is connected to the radio frequency current source via a radio frequency feed line.

5. The magnetic resonance scanner as claimed in claim 4, characterized in that the radio frequency transmitter/receiver coil is connected to the amplifier via at least one radio frequency feed line.

6. The magnetic resonance scanner as claimed in claim 5, characterized in that the length of the radio frequency feed lines in each case corresponds to an integer multiple of the half of the wavelength.

7. A method for controlling a magnetic resonance system of a magnetic resonance scanner with a multiplicity of radio frequency transmitter/receiver units, in which,
(a) for the transmission, each radio frequency transmitter/receiver coil is coupled to an associated radio frequency current source in order to generate a certain radio frequency magnetic field,
(b) for the reception, the radio frequency transmitter/receiver coil in which a voltage is induced by a resonant magnetic field is coupled to an amplifier,
(c) a supply voltage is keyed by a changeover switch separate from the radio frequency transmitter/receiver coil the amplifier during transmission and the radio frequency current source during reception,
(d) wherein the changeover switch in a transmission mode causes a first diode arranged between the changeover switch and a capacitor of a series-resonant circuit and a second diode arranged between the radio frequency current source and the radio frequency transmitter/receiver coil to be brought into a conductive state such that the radio frequency current source actuates the radio frequency transmitter/receiver coil using a radio frequency coil current, and
(e) wherein the changeover switch in a reception mode causes the second diode to be brought into a high resistance state such that a voltage from the radio frequency transmitter/receiver coil reaches the amplifier via an inductor and the capacitor of the series-resonant circuit.

* * * * *

UNITED STATES PATENT AND TRADEMARK OFFICE
CERTIFICATE OF CORRECTION

| | | Page 1 of 1 |
|---|---|---|
| PATENT NO. | : 7,916,920 B2 | |
| APPLICATION NO. | : 12/600721 | |
| DATED | : March 29, 2011 | |
| INVENTOR(S) | : Frank Seifert | |

It is certified that error appears in the above-identified patent and that said Letters Patent is hereby corrected as shown below:

Replace Figure 1 with the drawing below

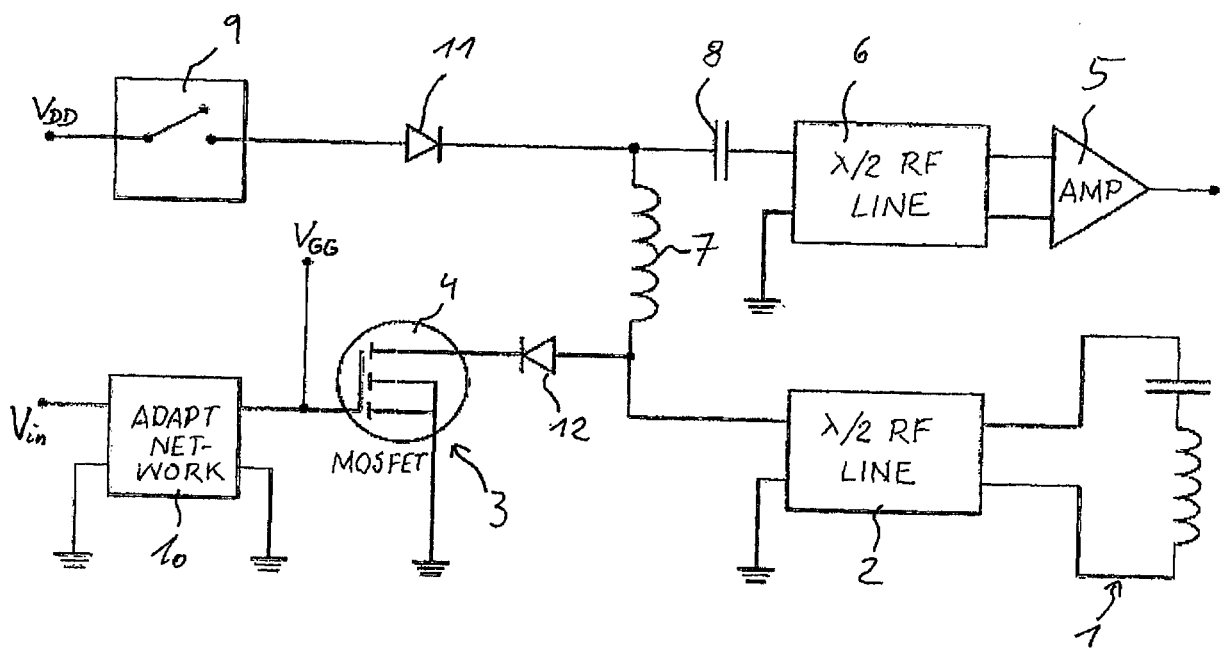

Figure 1

Signed and Sealed this
Twenty-eighth Day of June, 2011

David J. Kappos
*Director of the United States Patent and Trademark Office*

UNITED STATES PATENT AND TRADEMARK OFFICE
CERTIFICATE OF CORRECTION

PATENT NO. : 7,916,920 B2  Page 1 of 3
APPLICATION NO. : 12/600721
DATED : March 29, 2011
INVENTOR(S) : Frank Seifert et al.

It is certified that error appears in the above-identified patent and that said Letters Patent is hereby corrected as shown below:

Delete the title page and substitute therefore the attached title page showing the corrected illustrative figure.

Delete the Drawing Sheet and substitute therefore the attached Drawing Sheet consisting of the corrected figure.

This certificate supersedes the Certificate of Correction issued June 28, 2011.

Signed and Sealed this
Twenty-sixth Day of July, 2011

David J. Kappos
*Director of the United States Patent and Trademark Office*

CERTIFICATE OF CORRECTION (continued)

(12) United States Patent
Seifert et al.

(10) Patent No.: US 7,916,920 B2
(45) Date of Patent: Mar. 29, 2011

(54) TRANSMITTER/RECEIVER ANTENNA FOR MR WITH IMPROVED DECOUPLING BETWEEN ANTENNA ELEMENTS

(75) Inventors: Frank Seifert, Hohen Neuendorf (DE); Evgenia Kirilina, Berlin (DE); Thomas Riemer, Leipzig (DE)

(73) Assignees: Bundesrepublik Deustschland, vertreten durch das Bundesministerium für Wirtschaft und Technologie, dieses vertreten durch den Präsidenten der Physikalisch-Technischen Bundesanstalt, Braunschweig (DE); Universität Leipzig, Leipzig (DE)

( * ) Notice: Subject to any disclaimer, the term of this patent is extended or adjusted under 35 U.S.C. 154(b) by 0 days.

(21) Appl. No.: 12/600,721

(22) PCT Filed: May 15, 2008

(86) PCT No.: PCT/DE2008/000873
§ 371 (c)(1),
(2), (4) Date: Nov. 18, 2009

(87) PCT Pub. No.: WO2008/141638
PCT Pub. Date: Nov. 27, 2008

(65) Prior Publication Data
US 2010/0166279 A1 Jul. 1, 2010

(30) Foreign Application Priority Data
May 18, 2007 (DE) .................. 10 2007 023 542

(51) Int. Cl.
G06K 9/00 (2006.01)
(52) U.S. Cl. ........... 382/131; 378/4; 250/338.2; 430/39
(58) Field of Classification Search .............. 382/100, 382/128, 131, 320; 378/4–27; 250/338.2; 430/39
See application file for complete search history.

(56) References Cited

U.S. PATENT DOCUMENTS
4,764,726 A * 8/1988 Misic et al. ............... 324/322
(Continued)

FOREIGN PATENT DOCUMENTS
WO 4016 640 12/1991
(Continued)

*Primary Examiner* — Anand Bhatnagar
(74) *Attorney, Agent, or Firm* — Whitham Curtis Christofferson & Cook, PC

(57) ABSTRACT

A magnetic resonance tomograph is provided with a magnetic resonance system comprising at least two high-frequency transmitting/receiving units, each containing 1) a high-frequency transmitting/receiving coil, 2) a high-frequency current source that can be coupled to the high-frequency transmitting/receiving coil for transmitting, and 3) an amplifier that can be coupled to the high-frequency transmitting/receiving coil for receiving. A selector switch is provided, which keys a supply voltage to disconnect the amplifier during a transmission operation and the high-frequency current source during a receiving operation from the high-frequency transmitting/receiving coil. An inductor and a capacitor are provided between the high-frequency transmitting/receiving coil and the amplifier and form a series resonating circuit at the magnetic resonance frequency. A first diode is disposed between the selector switch and the capacitor of the series resonance circuit, and a second diode is disposed between the high-frequency current source and the high-frequency transmitting/receiving coil, such that the magnetic resonance system can be placed in a transmission mode by means of the selector switch, in that the first diode conducts and the high-frequency current source applies a high-frequency coil current to the high-frequency transmitting/receiving coil, and can be placed in a receiving mode, in that the second diode has high resistance and a voltage is applied to the amplifier from the high-frequency transmitting/receiving coil via the inductor and the capacitor.

7 Claims, 1 Drawing Sheet